(12) United States Patent
Gailus et al.

(10) Patent No.: US 6,259,301 B1
(45) Date of Patent: *Jul. 10, 2001

(54) METHOD AND APPARATUS FOR SELECTING FROM MULTIPLE MIXERS

(75) Inventors: Paul H. Gailus, Prospect Heights; Kevin J. McCallum, Algonquin, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/618,109

(22) Filed: Jul. 17, 2000

Related U.S. Application Data

(63) Continuation-in-part of application No. 08/589,134, filed on Jan. 19, 1996.

(51) Int. Cl.$^7$ .................................................. G06G 7/12
(52) U.S. Cl. .......................................... 327/355; 455/315
(58) Field of Search ..................................... 327/355, 356, 327/357, 359, 361, 105, 403; 455/103, 104, 105, 207, 209, 343, 314, 315

(56) References Cited

U.S. PATENT DOCUMENTS

| | | | |
|---|---|---|---|
| 3,631,339 | 12/1971 | Low | 324/76.33 |
| 4,408,352 | * 10/1983 | Dudding | 455/295 |
| 4,494,238 | 1/1985 | Groth, Jr. | 375/200 |
| 4,499,426 | 2/1985 | Parker | 327/355 |
| 4,525,862 | * 7/1985 | Parker | 455/47 |
| 4,931,746 | 6/1990 | Trankle et al. | 330/254 |
| 5,001,723 | 3/1991 | Kerr | 375/200 |
| 5,073,974 | 12/1991 | Nishimura | 455/103 |
| 5,237,286 | 8/1993 | Kimura et al. | 327/356 |
| 5,345,602 | * 9/1994 | Wiedemann et al. | 455/137 |
| 5,513,386 | 4/1996 | Ogino et al. | 455/234.1 |
| 5,551,076 | 8/1996 | Bonn | 455/333 |
| 5,648,985 | 7/1997 | Bjerde et al. | 455/84 |
| 6,147,543 | * 11/2000 | Gailus et al. | 327/355 |

* cited by examiner

Primary Examiner—My-Trang Nu Ton
(74) Attorney, Agent, or Firm—Jeffrey K. Jacobs

(57) ABSTRACT

An apparatus includes a current generator (101) having an output. A plurality of mixers (103, 105, and 107) is switchably coupled to the current generator output, such that a first average power output level is provided when a first mixer (103) of the plurality of mixers is engaged and a second average power output level is provided when a second mixer (105) of the plurality of mixers is engaged. Alternatively, a first average power output level is provided when a first mixer (103) and a second mixer (105) of the plurality of mixers is engaged and a second average power output level is provided when the first mixer (103) of the plurality of mixers is engaged. The first average power output level and the second average power output level are different.

23 Claims, 4 Drawing Sheets

METHOD AND APPARATUS FOR SELECTING FROM MULTIPLE MIXERS

CROSS REFERENCE TO RELATED APPLICATIONS

This application is a continuation-in-part of commonly-assigned U.S. application Ser. No. 08/589,134, titled "METHOD AND APPARATUS FOR SELECTING FROM MULTIPLE MIXERS" and filed on Jan. 19, 1996 on behalf of the same inventors of the present application, the disclosure of which prior application is hereby expressly incorporated by reference, verbatim, and with the same effect as though such disclosures were fully and completely set forth herein.

FIELD OF THE INVENTION

This invention relates to radio frequency communications, including but not limited to mixers in radio frequency communications.

BACKGROUND OF THE INVENTION

As is known, radio frequency (RF) transmitters modulate baseband signals, such as analog voice or digital voice samples, onto an RF carrier, amplify the RF carrier, and transmit the RF carrier, via an antenna, through the air as electromagnetic energy. The electromagnetic energy is subsequently received by a receiver's antenna, demodulated back to the baseband signal, and rendered audible (if voice was transmitted) by the receiver.

A mixer is a three port, time varying network that translates a signal at one frequency to some other frequency. For example, baseband signals may be mixed, i.e., modulated, to an intermediate frequency (IF) and then mixed again to the carrier frequency. In a zero IF transmitter, baseband signals are mixed directly to the carrier frequency. To effect this translation, the baseband signal is heterodyned or mixed in a non-linear device with an RF signal from a local oscillator.

In zero IF transmitters, an upmixer and a selectable attenuator are used to adjust the average power output level of the transmitter; The upmixer draws the same current, no matter what power output is chosen for the selectable attenuator, in order to provide good signal to noise ratio. The upmixer draws the same current whether it is used with a class A amplifier, which draws the same current all the time, a class B amplifier, in which the amplifier current tracks power all the time (in other words, when there is no output power, there is no current draw), or class AB amplifier, where the current draw of the amplifier tracks the power level at high power or peaks, but idles at a fixed current for lower power output.

Accordingly, there is a need for an upmixer that is more efficient at drawing current when less average power is output by the power amplifier than when higher power is output by the amplifier, while providing good signal to noise ratio.

DESCRIPTION OF A PREFERRED EMBODIMENT

Figure 1:
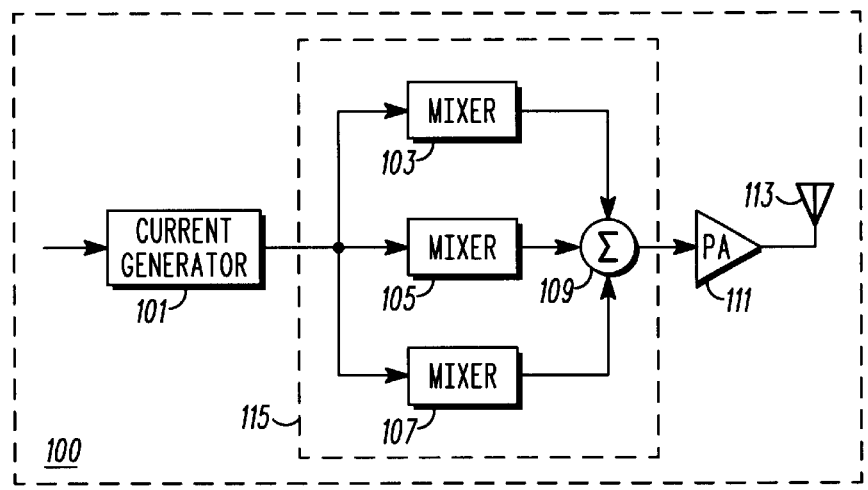
FIG. 1 is a block diagram of an RF communication unit comprising a plurality of mixers in accordance with the invention.

The following describes an apparatus for and method of utilizing multiple mixers in an upmixer in order to provide an upmixer that draws current proportionally to the average power output level. One of many mixers is chosen to provide mixing at the desired average power output level. In the preferred embodiment, three different-sized mixers provide three different average power output levels separated by approximately 10 dB. In addition, each of the mixers provides two or more average power output levels by switching in one, two, or more current mirrors within the mixer.

An apparatus comprises a current generator having an output. A plurality of mixers is switchably coupled to the current generator output, such that a first average power output level is provided when a first mixer of the plurality of mixers is engaged and a second average power output level is provided when a second mixer of the plurality of mixers is engaged, wherein the first average power output level and the second average power output level are different.

Alternatively, the apparatus may comprise a current generator having an output, a current mirror coupled to the current generator output, and a plurality of selectable mixers operably coupled to the current mirror, such that a first average power output level is provided when a first of the plurality of mixers is engaged and a second average power output level is provided when a second of the plurality of mixers is engaged, wherein the first average power output level and the second average power output level are different.

In the preferred embodiment, the first average power output level is higher in power than the second average power output level, and the second mixer draws less current than the first mixer, and further, the first average power output level is the highest average power level of the apparatus, and the second average power output level is substantially 10 dB below full power. Also in the preferred embodiment, a third mixer of the plurality of mixers provides a third average power output level that is substantially 20 dB below full power.

In addition, at least one of the plurality of mixers may provide at least two different average power output level settings, and further, the average power output level setting is a higher power output level than the second average power output level setting, and the at least one of the plurality of mixers draws less current when operating at the second average power output level setting than when operating at the first average power output level setting.

Alternatively, the apparatus may comprise at least two current mirror transistors, and when a first of the at least two current mirror transistors is engaged, the at least one of the plurality of mixers operates at a first average power output level setting and when the first and a second of the at least two current mirror transistors is engaged, the at least one of the plurality of mixers operates at a second average power output level setting. Further, the first average power output level setting and the second average power output level setting may be different. When the first average power output level setting is higher in power than the second average power output level setting, the first current mirror transistor draws less current than the first current mirror transistor and the second current mirror transistor combined.

In the preferred embodiment, the current generator and the plurality of mixers and, if implemented, a current mirror, are disposed in a radio frequency communication unit.

In the present invention, the method comprises the steps of generating a current proportional to an input signal. An average power output level is established for a transmitter. A first mixer of a plurality of mixers is selected, wherein each of the plurality of mixers has a different average power output level, and wherein the first mixer has a power output level at the established average power output level. The proportional current is applied to the first mixer.

In addition, the first mixer may provide at least two different average power output level settings, including a maximum average power output level setting and a minimum average power output level setting, and the step of selecting further comprises the steps of, when the established average power output level is closer to the maximum average power output level setting than to any other of the at least two different average power output level settings, switching into operation a first current mirror and a second current mirror from a plurality of current mirrors disposed within the first mixer; and when the established average power output level is lower than the maximum average power output level setting, switching into operation only the first current mirror.

Alternatively, the first mixer may provide at least three different average power output level settings including a maximum average power output level setting and a minimum average power output level setting, and the step of selecting further comprises the steps of, when the established average power output level is closer to the maximum average power output level setting than to any other of the at least three different average power output level settings, switching into operation a first current mirror, a second current mirror, and a third current mirror from a plurality of current mirrors disposed within the first mixer; when the established average power output level is lower than the maximum average power output level setting and higher than the minimum average power output level setting, switching into operation only the first current mirror and the second current mirror; and when the established average power output level is closer to the minimum average power output level setting than to any other of the at least three different average power output level settings, switching into operation only the first current mirror. As an alternative, when the established average power output level is closer to the maximum average power output level setting than to any other of the at least three different average power output level settings, a first current mirror from a plurality of current mirrors disposed within the first mixer may be switched into operation; when the established average power output level is lower than the maximum average power output level setting and higher than the minimum average power output level setting, a second current mirror of the plurality of current mirrors may be switched into operation; and when the established average power output level is closer to the minimum average power output level setting than to any other of the at least three different average power output level settings, a third current mirror of the plurality of current mirrors may be switched into operation, wherein the first current mirror, the second current mirror, and the third current mirrors are different.

An RF communication unit 100 comprising an upmixer comprising a plurality of mixers in accordance with the present invention is shown in FIG. 1. A current generator 101 receives an input signal in the form of a voltage and outputs a current to a plurality of mixers 103, 105, and 107. The input signal is a baseband signal that is translated to an RF transmission frequency by the upmixer 115 in the preferred embodiment. Although three mixers 103, 105, and 107 are shown in the drawings, successful implementation is achievable using 2, 3, 4 or more mixers. The output of the plurality of mixers 103, 105, and 107 is input to a summer 109. The output of the summer is input into a power amplifier (PA) 111, which outputs the signal to an antenna 113. The current generator 101 and mixers 103, 105, and 107 will be described later in detail.

Figure 2:
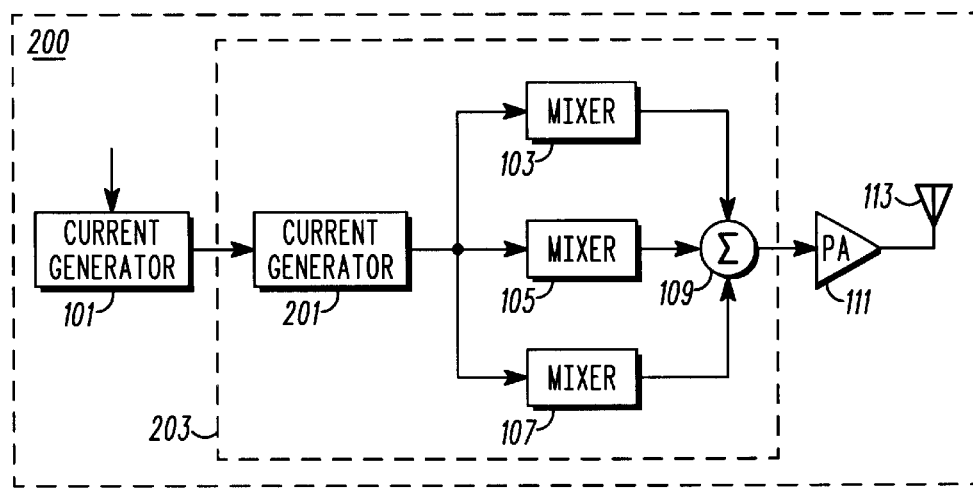
FIG. 2 is a block diagram of an RF communication unit comprising an upmixer in accordance with the invention.

An RF communication unit 200 containing an upmixer 203 in accordance with the present invention is shown in FIG. 2. In this alternative embodiment of the present invention, the same current generator 101, plurality of upmixers 103, 105, and 107, summer 109, PA 111, and antenna 113 are implemented in addition to a current mirror 201. The difference between FIG. 2 and FIG. 1 is that the output of the current generator 101 is input into the current mirror 201, and the output of the current mirror 201 is input to the plurality of mixers 103, 105, and 107. The upmixer in FIG. 2 comprises the current mirror 201, the plurality of mixers 103, 105, and 107, and the summer 109. An example circuit for the current mirror 201 is shown in the current mirror reference transistor circuit of FIG. 5 and the current mirror transistor bank 403 of FIG.4. This particular design provides better low voltage performance than the circuit of FIG. 1, because the current output of the current generator is referenced to Vcc while the current output of the current mirror is referenced to ground. Referencing to ground allows the mixer to reference to ground, thereby reducing the allowable minimum voltage necessary at the mixer outputs. The RF communication unit 100 or 200 may be a portable or mobile radio, such as an iDEN™ mobile or portable available from Motorola, Inc.

Figure 3:
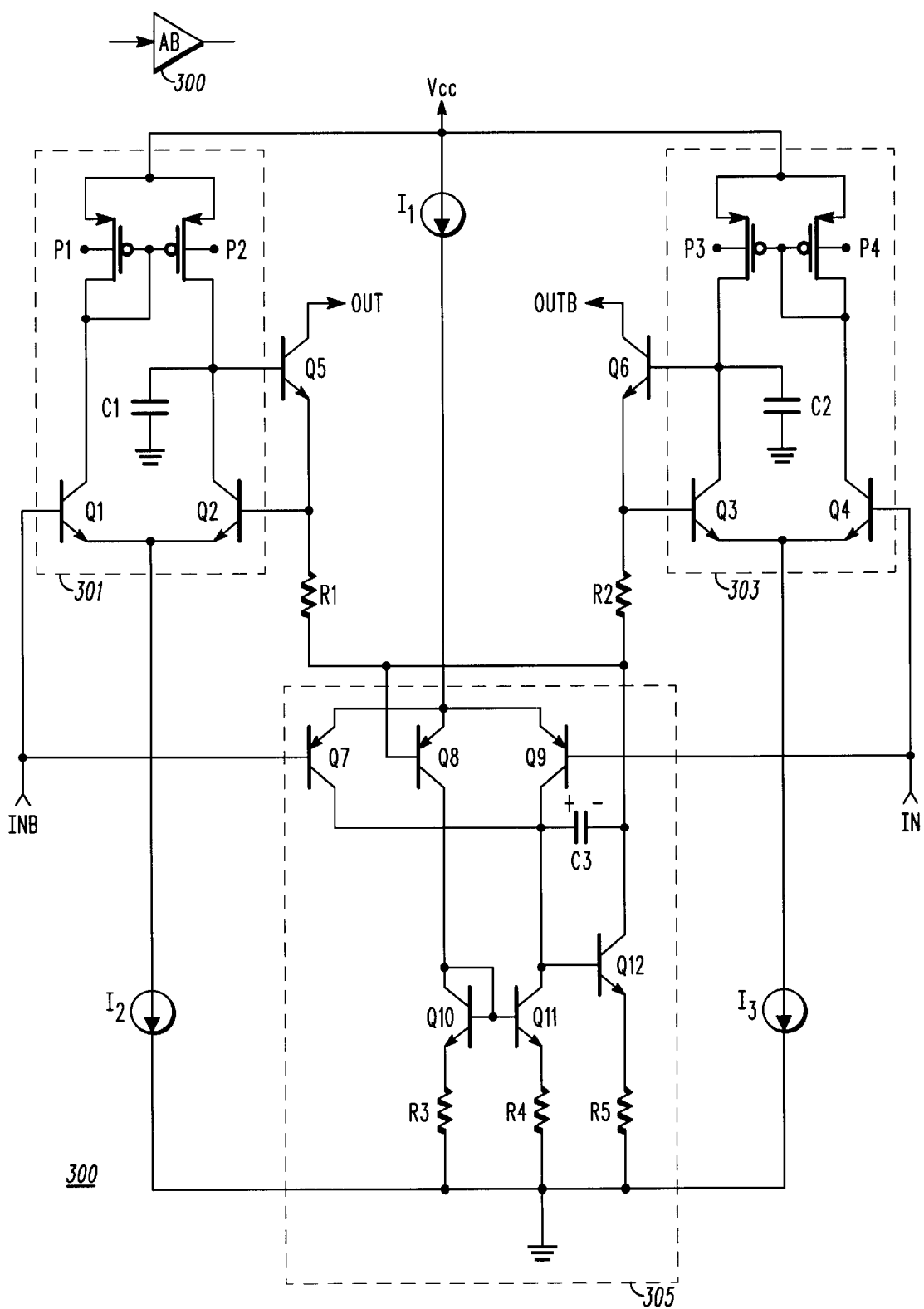
FIG. 3 is a schematic diagram of a current generator in accordance with the invention.

A schematic diagram of the current generator 101 in the form of a class AB amplifier 300 is shown in FIG. 3. Note that the signals in the preferred embodiment are differential signals, although only a single line is shown in FIG. 1 and FIG. 2. The signals, e.g., inputs as IN and INB and outputs as OUT and OUTB, are shown in differential form within the block diagrams of FIG. 3, FIG. 4, and FIG. 5.

The current generator is comprised of two differential amplifiers 301 and 303. The two differential amplifiers 301 and 303, two transistors Q5 and Q6, and the two resistors R1 and R2 form a current mode feedback pair. Current source I1 and circuit 305 form a bias current circuit that keeps the transistors Q5 and Q6 in the active region. Circuit 305 transfers the lower voltage of the input signal, IN and INB, to the junction of R1 and R2. Transistors Q2 and Q3 are physically smaller than transistors Q1 and Q4 so that even if the IN and INB voltages are identical, the voltages at the transistor Q2 and Q3 bases are slightly larger than the voltages at the inputs, IN and INB, thereby providing a small current flow in R1 and R2. During normal operation, each of the inputs, IN and INB, which comprise a differential input, will differ in value. The lower of the pin voltages at the inputs IN and INB will be sensed by transistors Q7 and Q8 or transistors Q9 and Q8, and duplicated at the resistor junction R1, R2 by the action of the current output through Q12. The input pin voltages IN and INB are also present at the emitters of transistors Q5 and Q6, respectively, by the current mode feedback circuit 301 and Q5 or 303 and Q6. Because the lower of the two pin voltages is at the resistor junction R1, R2, the current mode feedback circuit with the larger of the two input pin voltages will generate a current through the resistor R1 or R2, the value of which is the differential input voltage divided by the resistor value. In this manner, a differential current and a common mode current that are proportional to the input differential voltage are generated and provided at the output.

Figure 4:
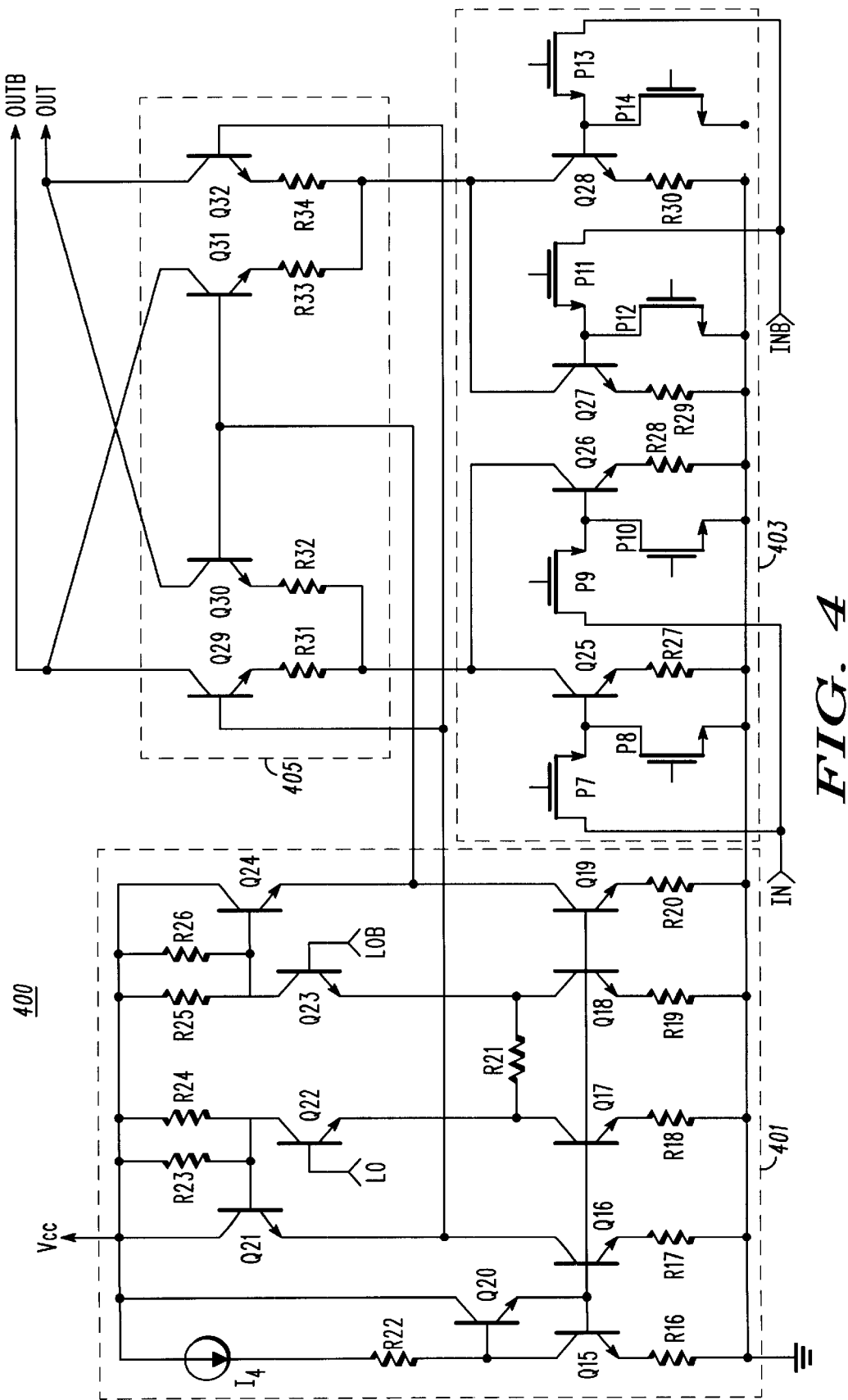
FIG. 4 is a schematic diagram of a mixer in accordance with the invention.

A schematic diagram of a mixer 103, 105, or 107 in the preferred embodiment is shown in FIG. 4. This type of mixer is referred to as a Gilbert cell mixer. In the preferred embodiment, each mixer comprises a local oscillator buffer 401, a selectable current mirror transistor bank 403, and a transistor switch array 405 that provides mixing functionality. A selectable RF mixer may comprise one of the selectable current mirror transistors of the bank 403 and the transistor switch array 405. The local oscillator buffer 401 is added in the preferred embodiment, but is not necessary for successful practice of the present invention. Although the same schematic may be used for each of the mixers 103, 105, and 107, the resistor values and transistor sizes are scaled to provide different average power output values for each of the mixers. The appropriate mixer 103, 105, or 107 is switched into operation by applying current to the appropriate current mirror transistor(s) within the mixers 103, 105, and 107. In the preferred embodiment, the first mixer 103 provides a full (average) power signal to the PA. The second mixer 105 provides a signal 10 dB down from full power. The third mixer 107 provides a signal 20 dB down from full power. Thus, when the first mixer 103 is switched into operation in the transmitter circuit, a full power transmission may be made. When the second mixer 105 is switched into the transmitter circuit, a signal 10 dB down from full power is transmitted by the PA 111. When the third mixer 107 is switched into operation in the transmitter circuit, a signal 20 dB down from full power of the PA 111 is provided. Because the second mixer 105 and the third mixer 107 are scaled down versions of the first mixer 103, these mixers 105 and 107 draw less current than their larger counterpart mixer 103 when they 105 and 107 are switched into operation. Similarly, the third mixer 107 draws less current than the second mixer 105 when the third mixer is switched into operation.

Circuit 401 isolates the local oscillator (LO) signal, LO and LOB, from the transistor switch array 405. There are two distinct advantages to incorporating the LO buffer and RF mixer into selectable mixers rather than using a common LO buffer and RF mixer. The first advantage is current savings. The LO buffer current that is required to switch the transistor switch array 405 at any given frequency is dependent on the size of the transistor switch array 405 devices. The size of the transistor switch array 405 devices substantially matches the size of the current mirror transistors in the selectable current mirror transistor bank 403. For the first mixer 103, the RF switch 405 devices are the largest since mixer 103 provides the greatest power, and therefore, current output. The transistor switch array 405 devices are reduced for the second mixer 105 and reduced further for the third mixer 107. As the transistor switch array 405 devices are reduced in size, the current required by the LO buffer is also reduced. The second advantage is the isolation of the LO signal from the mixer output. The mixers 103, 105 and 107 are often referred to as balanced mixers. One advantage of a balanced mixer is that the LO signal is ideally cancelled in the circuit's output. This cancellation is never completely achieved in practice due to errors in the matching of the circuit components and in parasitic elements that form electrical paths for the LO signal from the base of the transistor switch array 405 to the output. These parasitic paths are formed by the junction capacitance that exists in all semiconductor devices and whose value is determined by the device's physical size. Typically, LO signal levels at the output of balanced mixers are referred to as LO feedthrough and are usually measured relative to the mixer's desired signal output. Operating the mixer at a reduced power setting by switching from the first mixer 103 to the second mixer 105 or the third mixer 107 reduces the size of the transistor switch array 405 devices and at the same time reduces the amount of LO signal present at the output due to the parasitic capacitance such that the relative amount of LO feedthrough remains at the same or a lower level than was measured with the higher powered mixer 103.

In addition to providing a 10 dB step differential for average power output between the first mixer 103 and the second mixer 105, and also between the second mixer 105 and third mixer 107, the present invention provides for an apparatus for providing smaller power differentials within each of the mixers 103, 105, and 107. These smaller average power output differentials are provided by two or more current mirror transistors 403 within each mixer 103, 105, or 107.

Two current mirror transistors 403 are provided for each part of the balanced transistor switch array 405. These current mirrors will be referenced herein by the name of the transistor that mirrors the current, e.g., Q25, Q26, Q27, and Q28. If the maximum average power output for a particular mixer is desired, both current mirror circuits (Q25, Q28 and Q26, Q27) are turned on. If less than maximum average power output for the particular mixer is desired, a 5 dB power differential may be achieved in the preferred embodiment by turning on only one of the current mirrors, i.e., Q25 and Q28 or Q26 and Q27. As is known in the art, when the current mirrors Q25 and Q26 are turned on, the current mirrors Q27 and Q28 are also turned on because of the balanced nature of the mixer. Similarly, if the current mirror Q25 or Q26 is turned on, the appropriate counterpart current mirror Q28 or Q27 is also turned on. Although the current mirrors Q25, Q26, Q27, and Q28 and the resistors R27, R28, R29, and R30 have identical values, there is a preferred pairing in the preferred embodiment. This pairing is a result of the physical implementation of the circuit. In the preferred embodiment, a symmetrical integrated circuit layout of the current mirrors Q25 with Q28 and resistors R27 with R30 provides the current mirrors with the best matching characteristics and reduces LO feedthrough due to mismatch errors. The same matching also applies to the current mirrors Q26, Q27 and resistors R28, R29.

Because of the selectable current mirrors operating in conjunction with the mixers, each mixer is able to provide at least two different average power output levels, a maximum average power output level and an average power output level 5 dB below that maximum average power output level. In the preferred embodiment, the first mixer 103 provides full power and 5 dB down from full power as its average power output levels; the second mixer 105 provides 10 dB down from full power and 15 dB down from full power as its average power output levels. One of skill in the art would recognize that two different size current mirrors may be implemented instead of using two current mirrors of the same size, as is done in the preferred embodiment. With this alternate implementation, the larger current mirror is switched in where two current mirrors are engaged in the preferred embodiment, and the smaller mirror is switched in where one current mirror is engaged in the preferred embodiment. This alternate implementation is, however, less efficient for cases where the amount of current in the pairs requires the use of physically larger devices, as for example, with the first and second mixers 103 and 105 of the preferred embodiment. When the amount of current being switched does not require a physically larger device, a more direct approach is to choose only one of the current mirror pairs for each desired power output level, as is the case for the third mixer 107 in the preferred embodiment. In the third mixer 107, all the device pairs are the same size in the preferred embodiment, so that no increase in integrated circuit area is required.

In the preferred embodiment, a third current mirror transistor (not shown) is inserted into the selectable current mirror array 403 in parallel with the current mirror circuit Q25 and Q26 and also another one (not shown) in parallel with the current mirror circuit Q27 and Q28. Thus, the third mixer 107 in the preferred embodiment provides three different average power output levels, 20 dB down from full power when the first current mirror circuit Q25 and Q28 is engaged, 25 dB down from full power when the second current mirror circuit Q26 and Q27 is engaged, and 30 dB down from full power when the third current mirror circuit (not shown) is engaged. The third current mirror transistor is not shown in FIG. 4, but the third current mirror circuit contains similar circuit elements as the first current mirror circuit Q25 and Q28 or the second current mirror circuit Q26 and Q27. The third current mirror is placed in parallel with the first current mirror circuit Q25 and Q28, in the same way that the first current mirror circuit Q25 and Q28 is parallel to the second current mirror circuit Q26 and Q27. Several advantages result from using selectable current mirrors 403 in a balanced mixer. The operating current of the mixer is reduced when the power output of the mixer is reduced. The LO feedthrough that is generated by device mismatch scales with the size of the device, so that the LO feedthrough remains at a relatively constant level with respect to the desired signal over a 30 dB output power range. The noise of the mixer is reduced with increasing emitter resistor (R27, R28, R29, and R30) degeneration, enabling the signal to noise ratio to remain constant over the 30 dB power output range. This particular method is better than lowering the current drain by operating all circuits at a lower average power and amplifying later because such a method has a very high signal to noise ratio, as is known in the art. In the preferred embodiment, average power output levels given above are substantially at, e.g., 0 dB, −5 dB, −10 dB, and so forth, having ±1 dB estimation error.

Figure 5:
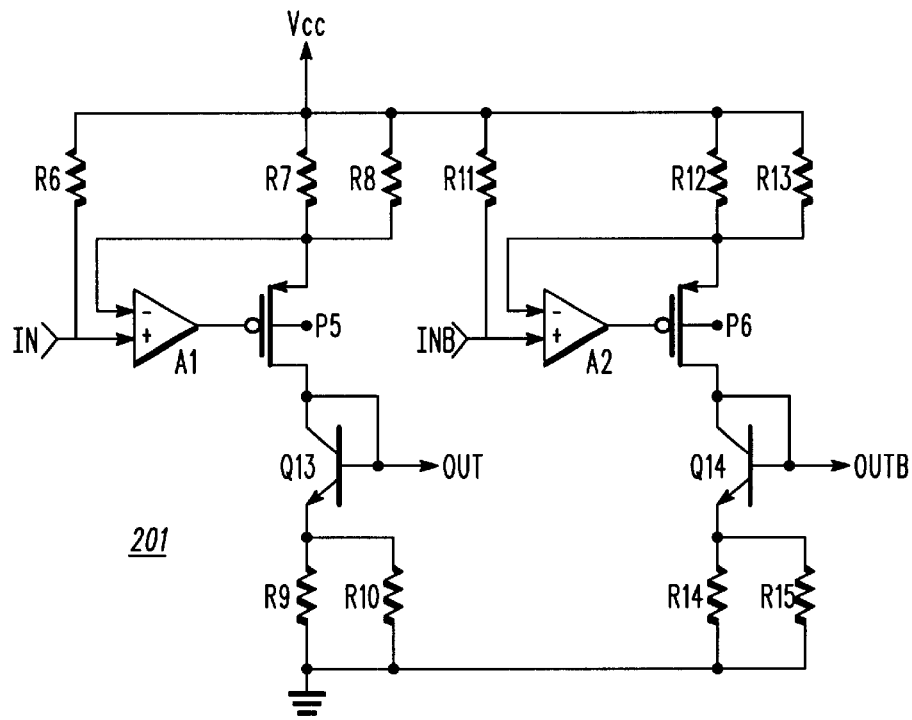
FIG. 5 is a schematic diagram of a current mirror reference transistor circuit in accordance with the invention.

A current mirror, such as the one shown in FIG. 2, is shown in the current mirror reference transistor circuit of FIG. 5 and the current mirror transistor bank 403 of FIG. 4. The current mirror reference transistor circuit 201, in the preferred embodiment, comprises eight resistors, two FETs P5 and P6, two bipolar transistors Q13 and Q14, and two operational amplifiers A1 and A2. This particular current mirror allows better operation of a plurality of mixers at low input voltages, e.g., >2.5 volts.

In the preferred embodiment, the circuitry of FIG. 1, FIG. 2, FIG. 3, FIG. 4, and FIG. 5 is implemented in a 0.5 mm BICMOS (bipolar integrated complementary metal oxide silicon) integrated circuit. The output frequency range is baseband to 2.5 GHz with programmable average power output level ranging from −30 dBm to 0 dBm (200 ohm load). Vcc is 3 V.

In the preferred embodiment, the component values for FIG. 3 are as follows. Capacitors C1, C2, and C3 are 2 pF capacitors. Resistors R1 and R2 are 450 ohms; resistors R3 and R4 are 5k ohms; and R5 is 200 ohms. Transistors P1, P2, P3, and P4 are PMOS (p-channel metal oxide silicon) field effect transistors (FETs), with 43 mm width and 4 mm length. Transistors Q7, Q8, and Q9 are lateral PNP bipolar transistors. Transistors Q1, Q4, Q5, Q6, and Q12 are 6 mm by 51 mm emitter NPN bipolar transistors. Transistors Q2, Q3, Q10, and Q11 are 1 mm by 2 mm emitter NPN bipolar transistors. The component values for FIG. 5 are as follows. Resistors R7, R8, R12, R13 are 470 ohms; resistors R9, R10, R14, R15 are 512 ohms; and resistors R6 and 11 are 450 ohms. Transistors Q13 and Q14 are multi-emitter interdigitated bipolar transistors, having 6 base and 5 emitters of width 1 mm and length 15 mm. Transistors P5 and P6 are FETs of width 1200 mm and length 3 mm.

The component values for FIG. 4 when FIG. 4 represents the first mixer 103 are as follows. Resistor R16 is 1k ohms; resistors R17 and R20 are 100 ohms; resistors R18 and R19 are 20 ohms; resistor R21 is 6 ohms; resistor R22 is 1.2k ohms; resistors R23, R24, R25, and R26 are 50 ohms; resistors R27, R28, R29, and R30 are 32 ohms; and resistors R31, R32, R33, and R34 are 5 ohms. Transistors Q16, Q17, Q18, Q19, Q21, Q22, Q23, and Q24 are multi-emitter interdigitated bipolar transistors, having 6 base and 5 emitters of width 1 mm and length 15 mm. Transistors Q29, Q30, Q31, and Q32 are multi-emitter interdigitated bipolar transistors, having 6 base, 5 emitters of width 1 mm and length 15 mm, four in parallel. Transistors Q25, Q26, Q27, and Q28 are multi-emitter interdigitated bipolar transistors, having 6 base, 5 emitters of width 1 mm and length 15 mm, two in parallel. Transistors P7, P9, P11, and P13 are NMOS (n-channel metal oxide silicon) field effect transistors (FETs), with 180 mm width and 1 mm length. Transistors P8, P10, P12, and P14 are NMOS (n-channel metal oxide silicon) field effect transistors (FETs), with 12 mm width and 1 mm length.

The component values for FIG. 4 when FIG. 4 represents the second mixer 105 are as follows. Resistor R16 is 1k ohms; resistors R17 and R20 are 125 ohms; resistors R18 and R19 are 125 ohms; resistor R21 is 10 ohms; resistor R22 is 6.5k ohms; resistors R23, R24, R25, and R26 are 400 ohms; resistors R27, R28, R29 and R30 are 128 ohms; and resistors R31, R32, R33, and R34 are 5 ohms. Transistors Q16, Q17, Q18, Q19, Q21, Q22, Q23, and Q24 are NPN bipolar transistors, having 1 mm by 8 mm emitter, two in parallel. Transistors Q25, Q26, Q27, Q28, Q29, Q30, Q31, and Q32 are multi-emitter interdigitated bipolar transistors, having 6 base and 5 emitters of width 1 mm and length 15 mm. Transistors P7, P9, P11, and P13 are NMOS (n-channel metal oxide silicon) field effect transistors (FETs), with 180 mm width and 1 mm length. Transistors P8, P10, P12, and P14 are NMOS (n-channel metal oxide silicon) field effect transistors (FETs), with 12 mm width and 1 mm length.

The component values for FIG. 4 when FIG. 4 represents the third mixer 107 are as follows. Resistor R16 is 1k ohms; resistors R17 and R20 are 125 ohms; resistors R18 and R19 are 125 ohms; resistor R21 is 10 ohms; resistor R22 is 5.5k ohms; resistors R23, R24, R25, and R26 are 400 ohms; resistors R27 and R30 are 350 ohms; resistors R28 and R29 are 200 ohms; and resistors R31, R32, R33, and R34 are 5 ohms. The values of the resistors (not shown) in the third current mirror in circuit 403 are 650 ohms. Transistors Q16, Q17, Q18, Q19, Q21, Q22, Q23, and Q24 are NPN bipolar transistors, having 1 mm by 8 mm emitter, two in parallel. Transistors Q25, Q26, Q27, and Q28 are multi-emitter interdigitated bipolar transistors, having 6 base, 5 emitters of width 1 mm and length 15 mm. Transistors Q29, Q30, Q31, and Q32 are NPN bipolar transistors, having 1 mm by 8 mm emitter, two in parallel. Transistors P7, P9, P11, and P13 are NMOS (n-channel metal oxide silicon) field effect transistors (FETs), with 180 mm width and 1 mm length. Transistors P8, P10, P12, and P14 are NMOS (n-channel metal oxide silicon) field effect transistors (FETs), with 12 mm width and 1 mm length. The values of the transistors (not shown) in the third current mirror in circuit 403 are the same as those for Q25, Q26, Q27, or Q28; and P7, P9, P11, or P13; and P8, P10, P12, or P14.

In the preferred embodiment, when one of the selectable current mirror transistors of the selectable current mirror transistor bank 403 of FIG. 4 is selected, the appropriate gate on transistor(s) P7, P9, P11, and/or P13 is high and the gate on the corresponding transistor(s) P8, P10, P12, and/or P14 is low.

Figure 6:
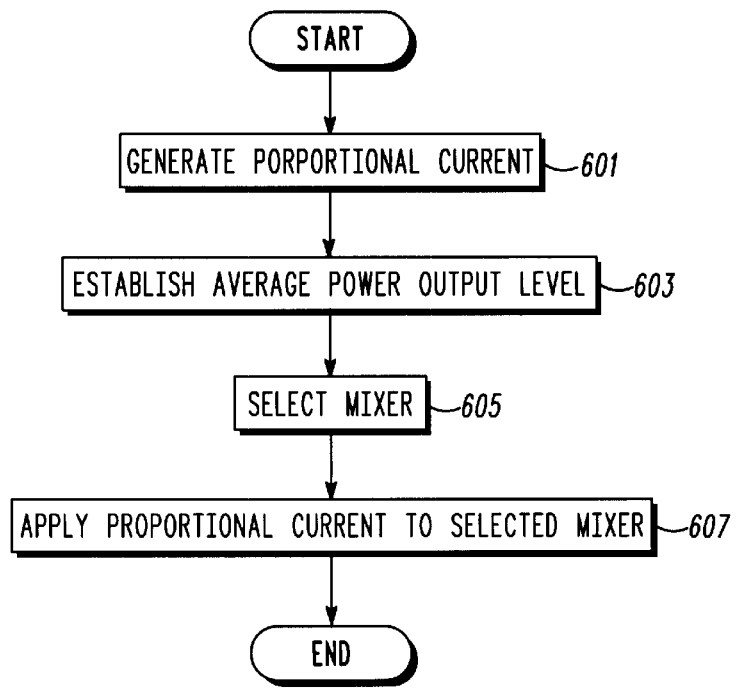
FIG. 6 is a flow chart showing a method of operation of a mixer combination in accordance with the invention.

A flow chart showing method of operation of this mixer combination is shown in FIG. 6. At step 601, a current proportional to an input signal is generated. At step 603, an average power output level for the transmitter is established. In other words, an average power output level from among the available average power output levels is chosen for the upmixer. In the preferred embodiment, full power as well as setting 5 dB, 10 dB, 15 dB, 20 dB, 25 dB, and 30 dB down from full power are available. At step 605, a mixer is selected from among the plurality of mixers 103, 105 and 107. This selected mixer has an average power output level at the average power output level established at step 603. At step 607, the proportional current is applied to the mixer selected at step 605. The step of selecting 605 also includes selecting or switching into operation the first current mirror and/or the second current mirror from a plurality of current mirrors that may be disposed with each mixer. For example, if 5 dB down from full power is desired for the output signal, the first mixer 103 is selected, and only one current mirror is engaged into operation, thereby providing a −5 dB average power output level from the upmixer 115 or 203. If, for example, −25 dB operation were desired in the preferred embodiment, the third mixer 107 would be selected at step 605, and two of the current mirrors would be placed into operation to provide −25 dB from full average power output transmission.

An alternative embodiment of the preferred invention comprises the use of simultaneously selecting one, two, or more of the plurality of mixers such that the combined total of each of the selected individual mixers' output power levels yields the desired power output level for the transmitter. The summer 109 would provide the added power for each activated or engaged mixer 103, 105, 107 to the PA 111. Each mixer may provide the same output power level, or may provide a different power output level. For example, giving values in Watts rather that dB for simplicity, if the first mixer has a power output level of 5 W, the second mixer has a power output level of 3 W, a third and a fourth mixer each have a power output level of 1 W, then any power output level from 1 W to 10 W may be provided as an output power level for the transmitter by selecting a combination of these mixers. For example, for a transmit power of 7 W, the first mixer (5 W) and the third and four mixers (1 W each) would be selected/activated. For a 10 W transmit power output level, all the mixers would be selected/activated. For 4 W output, the second mixer (3 W) and third mixer (1 W) would be selected and thereby engaged/activated. In this way, the added or combined powers of each mixer provide the desired power output, as an alternative to selecting one mixer of many, each having different power output levels to provide the desired power output level.

Thus, by using a current generator that takes average current and adjusts to accommodate these signal current swings, and providing a plurality of mixers which are switched in one at a time, current drain and power dissipation are both minimized because the mixer now uses less current than was provided by prior art circuits. Thus, current drain is not the same no matter what power or modulation settings are used, and a more efficient current draw for the mixer is provided because the current drain for the upmixer is proportional to the average power output level, rather than being constant at a higher level. Carrier feedthrough due to device mismatch remains constant on a relative basis when compared to the desired power output because the devices are scaled along with the power output. Carrier feedthrough due to parasitic coupling is also reduced by the use of scaled transistor switch array 405 and LO buffer 401 circuits in the mixers 103, 105, and 107. Mixer signal to noise remains constant over the 30 dB range due to the increasing of the emitter degeneration resistors as power is decreased.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A transmitter comprising:
   a current generator having an output;
   a plurality of mixers switchably coupled to the current generator output, such that a first average power output level of the transmitter is provided when a first mixer of the plurality of mixers and a second mixer of the plurality of mixers are activated and a second average power output level of the transmitter is provided when the first mixer of the plurality of mixers is activated, wherein the first average power output level and the second average power output level are different.

2. The transmitter of claim 1, wherein at least one of the plurality of mixers provides at least two different average power output level settings.

3. The transmitter of claim 2, wherein the first average power output level setting is a higher power output level than the second average power output level setting, and the at least one of the plurality of mixers draws less current when operating at the second average power output level setting than when operating at the first average power output level setting.

4. The transmitter of claim 1, wherein the transmitter further comprises at least two current mirror transistors, and when a first of the at least two current mirror transistors is engaged, the at least one of the plurality of mixers operates at a first average power output level setting and when the first and a second of the at least two current mirror transistors is engaged, the at least one of the plurality of mixers operates at a second average power output level setting.

5. The transmitter of claim 1, wherein the current generator and the plurality of mixers are disposed in a radio frequency communication unit.

6. The transmitter of claim 1, wherein the current generator has an input that is a differential voltage and wherein the output of the current generator is a current proportional to an input differential voltage.

7. The apparatus of claim 6, wherein the current is comprised of a common mode current and a differential mode current, and the common mode current is proportional to an input differential voltage.

8. An apparatus comprising:
   a current generator having an output;
   a current mirror coupled to the current generator output;
   a plurality of selectable mixers operably coupled to the current mirror, such that a first average power output level of the transmitter is provided when a first of the plurality of mixers and a second of the plurality of mixers are engaged and a second average power output level of the transmitter is provided when the first of the plurality of mixers engaged, wherein the first average power output level and the second average power output level are different.

9. The apparatus of claim 8, wherein at least one of the plurality of mixers provides at least two different average power output level settings.

10. The apparatus of claim 9, wherein the first average power output level setting is a higher power output level than the second average power output level setting, and the at least one of the plurality of mixers draws less current when operating at the second average power output level setting than when operating at the first average power output level setting.

11. The apparatus of claim 8, wherein the apparatus further comprises at least two current mirror transistors, and when a first of the at least two current mirror transistors is engaged, the at least one of the plurality of mixers operates at a first average power output level setting and when the first and a second of the at least two current mirror transistors is engaged, the at least one of the plurality of mixers operates at a second average power output level setting.

12. The apparatus of claim 8, wherein the current generator, the current mirror, and the plurality of mixers are disposed in a radio frequency communication unit.

13. The apparatus of claim 8, wherein the input signal to the current mirror is a current.

14. The apparatus of claim 8, wherein the current generator has an input that is a differential voltage and wherein the output of the current generator is a current proportional to an input differential voltage.

15. A method comprising the steps of:
generating a current proportional to an input signal;
establishing an average power output level of a transmitter, such that a first average power output level of the transmitter is provided when a first mixer of the plurality of mixers and a second mixer of the plurality of mixers are activated and a second average power output level of the transmitter is provided when the first mixer of the plurality of mixers is activated;
selecting one or more mixers of a plurality of mixers, and wherein the one or more mixers have a combined power output level at the established average power output level of the transmitter; and
applying the proportional current to the one or more mixers.

16. The method of claim 15, wherein the first mixer of the plurality of mixers provides at least two different average power output level settings including a maximum average power output level setting and a minimum average power output level setting, and wherein the step of selecting further comprises the steps of:
when the established average power output level is closer to the maximum average power output level setting than to the minimum average power output level setting, switching into operation a first current mirror and a second current mirror from a plurality of current mirrors disposed within the first mixer; and
when the established average power output level is closer to the minimum average power output level setting that to the maximum average power output level setting, switching into operation only the first current mirror.

17. The method of claim 15, wherein the first mixer provides at least three different average power output level settings including a maximum average power output level setting, a middle average power output level setting, and a minimum average power output level setting, and wherein the step of selecting further comprises the steps of:

when the established average power output level is closer to the maximum average power output level setting than to any other of the at least three different average power output level settings, switching into operation a first current mirror, a second current mirror, and a third current mirror from a plurality of current mirrors disposed within the first mixer;
when the established average power output level is closer to the middle average power output level setting than to any other of the at least three different average power output level settings, switching into operation only the first current mirror and the second current mirror; and
when the established average power output level is closer to the minimum average power output level setting than to any other of the at least three different average power output level settings, switching into operation only the first current mirror.

18. The method of claim 15, wherein the first mixer of the plurality of mixers provides at least three different average power output level settings including a maximum average power output level setting, a middle average power output level setting, and a minimum average power output level setting, and wherein the step of selecting further comprises the steps of:
when the established average power output level is closer to the maximum average power output level setting than to any other of the at least three different average power output level settings, switching into operation a first current mirror from a plurality of current mirrors disposed within the first mixer;
when the established average power output level is closer to the middle average power output level setting than to any other of the at least three different average power output level settings, switching into operation a second current mirror of the plurality of current mirrors; and
when the established average power output level is closer to the minimum average power output level setting than to any other of the at least three different average power output level settings, switching into operation a third current mirror of the plurality of current mirrors, wherein the first current mirror, the second current mirror, and the third current mirrors are different.

19. The method of claim 15, wherein the input signal is a differential voltage, thereby providing an input differential voltage.

20. The apparatus of claim 19, wherein the current is comprised of a common mode current and a differential mode current, and the common mode current is proportional to an input differential voltage.

21. A transmitter comprising:
a current generator having an output;
a plurality of mixers switchably coupled to the current generator output, such that when one or more mixers of the plurality of mixers is activated, an average power output level of the transmitter is provided by a combined power output level for the activated mixers, such that a first average power output level of the transmitter is provided when a first mixer of the plurality of mixers and a second mixer of the plurality of mixers are activated and a second average power output level of the transmitter is provided when the first mixer of the plurality of mixers is activated.

22. The transmitter of claim 21, wherein at least one of the plurality of mixers comprises a current mirror coupled to the current generator output.

23. The transmitter of claim 21, wherein at least one of the plurality of mixers provides at least two different average power output level settings.

* * * * *